United States Patent
Chen et al.

(10) Patent No.: US 9,969,078 B2
(45) Date of Patent: May 15, 2018

(54) TRANSFER HEAD ARRAY AND TRANSFERRING METHOD

(71) Applicant: MIKRO MESA TECHNOLOGY CO., LTD., Apia (WS)

(72) Inventors: Li-Yi Chen, Tainan (TW); Pei-Yu Chang, Tainan (TW); Chih-Hui Chan, Tainan (TW); Chun-Yi Chang, Tainan (TW); Shih-Chyn Lin, Tainan (TW); Hsin-Wei Lee, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days. days.

(21) Appl. No.: 14/816,060

(22) Filed: Aug. 3, 2015

(65) Prior Publication Data

US 2017/0036342 A1 Feb. 9, 2017

(51) Int. Cl.
*B25J 7/00* (2006.01)
*B25J 15/00* (2006.01)
*H01L 21/683* (2006.01)
*H01L 23/00* (2006.01)

(52) U.S. Cl.
CPC ............. *B25J 7/00* (2013.01); *B25J 15/008* (2013.01); *B25J 15/0052* (2013.01); *B25J 15/0085* (2013.01); *H01L 21/6833* (2013.01); *H01L 21/6835* (2013.01); *H01L 24/95* (2013.01); *H01L 2221/68354* (2013.01); *H01L 2221/68368* (2013.01); *H01L 2224/75725* (2013.01); *H01L 2224/95001* (2013.01)

(58) Field of Classification Search
CPC ........ B25J 7/00; B25J 15/008; B25J 15/0085; B25J 15/0052; H01L 21/6833

USPC .......................... 414/800; 294/81.6; 361/234
See application file for complete search history.

(56) References Cited

U.S. PATENT DOCUMENTS

| 4,119,211 A | * | 10/1978 | Boyer | ............... H01L 21/67144 198/403 |
| 5,718,557 A | * | 2/1998 | Perego | ................ B65G 47/082 414/798.9 |

(Continued)

FOREIGN PATENT DOCUMENTS

| CN | 1639841 A | 7/2005 |
| CN | 1960830 A | 5/2007 |

(Continued)

OTHER PUBLICATIONS

C. A. Bower et. al., "Transfer printing: An approach for massively parallel assembly of microscale devices", Electronic Components and Technology Conference, May 27-30, 2008, pp. 1105-1109.

*Primary Examiner* — Charles A Fox
*Assistant Examiner* — Joseph J. Sadlon
(74) *Attorney, Agent, or Firm* — McClure, Qualey & Rodack, LLP

(57) ABSTRACT

A transfer head array includes a body and a plurality of transfer heads. The body has a first surface, a second surface opposite to the first surface, and a plurality of recesses. The first surface has at least one chucking region and at least one interference avoidance region, and the recesses are separated from each other and are disposed in the interference avoidance region. The transfer heads are disposed on the chucking region.

22 Claims, 21 Drawing Sheets

(56) References Cited

U.S. PATENT DOCUMENTS

| | | | | |
|---|---|---|---|---|
| 5,839,769 | A * | 11/1998 | Slocum | H05K 13/0478 294/65 |
| 5,971,701 | A * | 10/1999 | Kawamura | H01L 21/67742 414/800 |
| 6,278,600 | B1 * | 8/2001 | Shamouilian | H01L 21/6831 361/234 |
| 6,669,801 | B2 | 12/2003 | Yoshimura et al. | |
| 7,785,422 | B2 * | 8/2010 | Autumn | B08B 7/0028 134/32 |
| 7,799,699 | B2 * | 9/2010 | Nuzzo | H01L 29/72 101/353 |
| 8,415,771 | B1 * | 4/2013 | Golda | B81C 99/0025 257/621 |
| 8,518,204 | B2 * | 8/2013 | Hu | H01L 24/83 156/249 |
| 8,722,458 | B2 * | 5/2014 | Rogers | H01L 21/00 257/88 |
| 9,021,983 | B2 * | 5/2015 | Inanami | H01L 21/67288 118/663 |
| 9,087,764 | B2 * | 7/2015 | Chan | H01L 27/156 |
| 9,105,492 | B2 * | 8/2015 | Bibl | B25J 15/0052 |
| 9,153,548 | B2 * | 10/2015 | Chan | H01L 27/156 |
| 9,178,123 | B2 † | 11/2015 | Sakariya | |
| 9,217,541 | B2 * | 12/2015 | Bathurst | F21K 9/00 |
| 9,296,194 | B2 * | 3/2016 | Canale | H01L 21/67092 |
| 9,308,649 | B2 * | 4/2016 | Golda | B25J 15/0085 |
| 9,318,475 | B2 * | 4/2016 | Bibl | G09F 9/301 |
| 9,548,233 | B2 * | 1/2017 | Golda | H01L 21/76898 |
| 2002/0015275 | A1 | 2/2002 | Sun et al. | |
| 2008/0055813 | A1 | 3/2008 | Son | |
| 2012/0027557 | A1 | 2/2012 | Ashdown et al. | |
| 2013/0130416 | A1 | 5/2013 | Bibl et al. | |
| 2014/0070289 | A1 * | 3/2014 | Tanaka | H01L 21/28291 257/295 |
| 2016/0029437 | A1 * | 1/2016 | Grohmann | B29C 35/0272 219/486 |
| 2016/0075036 | A1 * | 3/2016 | Lessing | B25J 15/12 361/234 |
| 2016/0136816 | A1 * | 5/2016 | Pistorino | B25J 9/1697 53/203 |
| 2016/0318190 | A1 * | 11/2016 | Prahlad | B25J 15/0085 |

FOREIGN PATENT DOCUMENTS

| | | |
|---|---|---|
| CN | 104054167 A | 9/2014 |
| JP | 4467720 B2 | 5/2010 |

\* cited by examiner
† cited by third party

TRANSFER HEAD ARRAY AND
TRANSFERRING METHOD

BACKGROUND

Packaging issues result in some of the obstacles for the manufacturing of micro devices, such as semiconductor sensors, semiconductor laser array, microelectromechanical systems (MEMS) and light-emitting diode (LED) display systems.

Transfer by wafer bonding from a carrier substrate to a receiving substrate is a traditional technology for transferring of devices. One such implementation is "direct bonding," involving one bonding step of an array of devices from a carrier substrate to a receiving substrate, followed by removal of the carrier substrate. Another such implementation is "indirect bonding," involving a mechanism to pick up the devices and move them to the bonding position of the receiving substrate. In indirect bonding, a transfer head may pick up an array of devices from a carrier substrate and then bond the array of devices to a receiving substrate, after which the devices are released from the transfer head.

SUMMARY

According to one embodiment of the present disclosure, a transfer head array is provided. The transfer head array includes a body and a plurality transfer heads. The body has at least one wall portion defining a plurality of recesses in the body. The wall portion has a top surface, and the top surface of the wall portion has a plurality of grip regions. At least two of the recesses are separated from each other by the wall portion. The transfer heads are respectively disposed on the grip regions.

According to another embodiment of the present disclosure, a micro device transferring method is provided. The method includes gripping at least one first micro device by a transfer head array, in which the transfer head array has at least one recess therein; and putting the first micro device gripped by the transfer head array on a receiving substrate, in which at least one object located on the receiving substrate is accommodated in the recess of the transfer head array.

BRIEF DESCRIPTION OF THE DRAWINGS

The invention can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
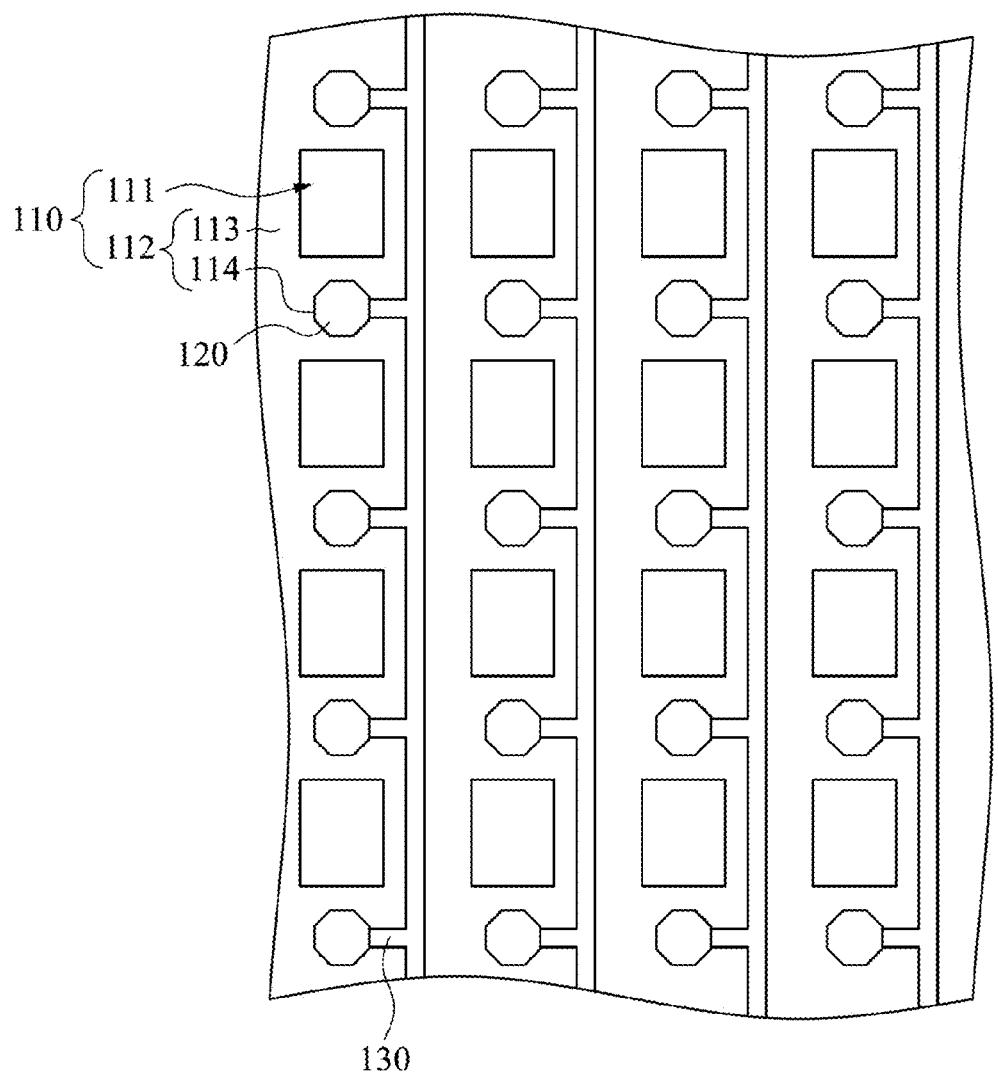
FIG. 1 is a schematic bottom view of a transfer head array according to one embodiment of this disclosure.

FIG. 1 is a schematic bottom view of a transfer head array 100 according to one embodiment of this disclosure. As shown in FIG. 1, the transfer head array 100 includes a body 110 and a plurality of transfer heads 120. The body 110 has at least one wall portion 112 defining a plurality of recesses 111 in the body 110. The wall portion 112 has a top surface 113, and the top surface 113 of the wall portion 112 has a plurality of grip regions 114. At least two of the recesses 111 are separated from each other by the wall portion 112. The transfer heads 120 are respectively disposed on the grip regions 114 (the grip regions 114 and the transfer heads 120 overlap with each other here).

Figure 2A:
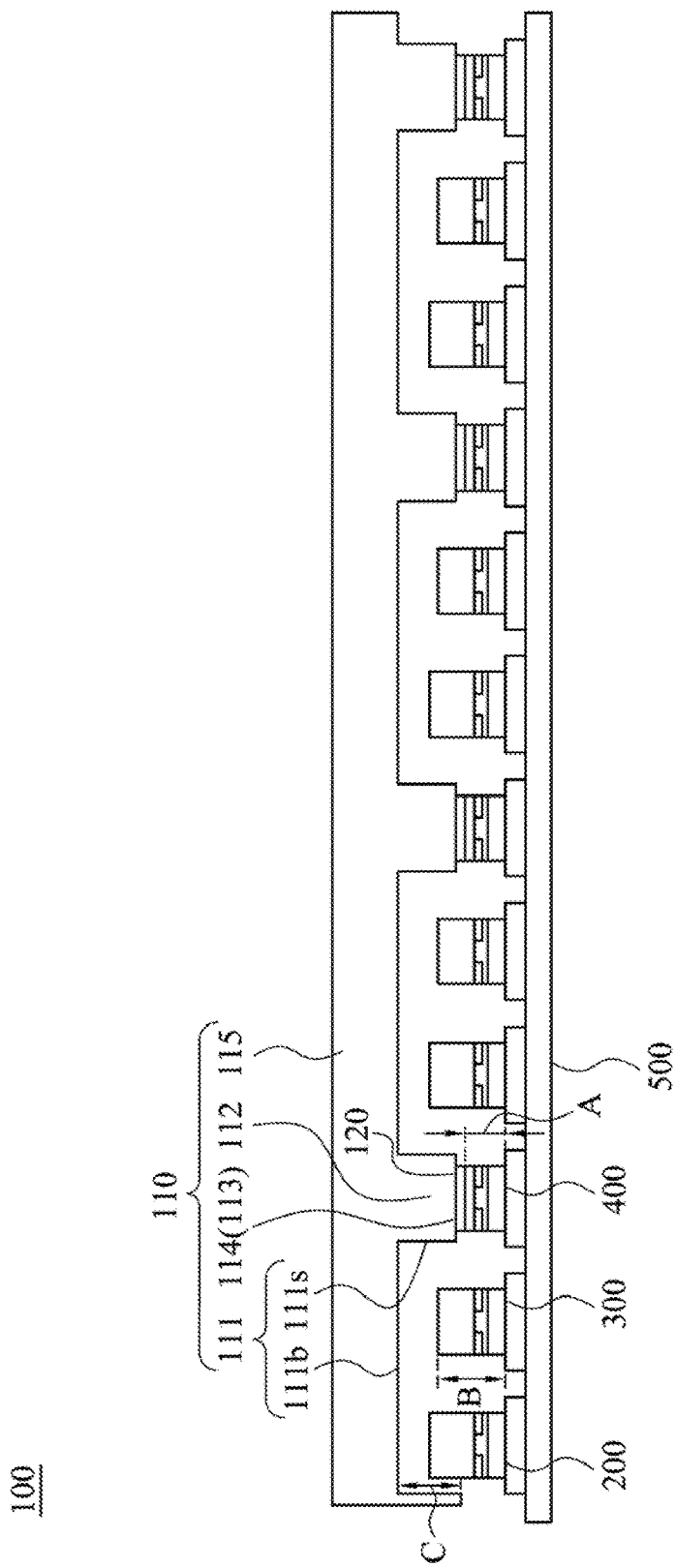
FIG. 2A is a schematic cross-sectional view of the transfer head array when first micro devices gripped by the transfer head array are put on a receiving substrate according to one embodiment of this disclosure.

FIG. 2A is a schematic cross-sectional view of the transfer head array 100 of FIG. 1 when first micro devices 400 gripped by the transfer head array 100 are put on a receiving substrate 500. As shown in FIG. 2A the transfer heads 120 are configured to pick up at least one first micro device 400 from a carrier substrate (not shown), the recesses 111 are configured to accommodate at least one object which is located on the receiving substrate 500 when the transfer heads 120 with the first micro device 400 touch the receiving substrate 500.

In the embodiment, the object is a second micro device 300 disposed on the receiving substrate 500. Embodiments of this disclosure are not limited thereto. In other embodiments, the object may be some components or protruding structures disposed on the receiving substrate 500. The object may also be some particles located on the receiving substrate 500, and the particles may affect the bonding of the first micro device 400.

Because the first micro device 400 and the second micro device 300 may be different types of micro devices, they may have different heights. Therefore, when the first micro device 400 is transferred from the carrier substrate to the receiving substrate 500 by the transfer head array 100, the second micro device 300 may already be disposed on the receiving substrate 500, and the height of the second micro device 300 may be greater than the height of the first micro device 400. In order to avoid mechanical interference with the second micro device 300, the transfer head array 100 has the recesses 111 to accommodate the second micro device 300 when the transfer heads 120 with the first micro device 400 touch the receiving substrate 500.

In other embodiments, the recesses 111 may accommodate objects other than the second micro device 300 located on the receiving substrate 500 to avoid mechanical interference with the objects.

Specifically, the first micro device 400 has a height A, the second micro device 300 has a height B, at least one of the recesses 111 has a depth C, and A+C>B (the thickness of the transfer heads 120 is not considered here since the transfer heads 120 may have a negligible thickness or the transfer heads 120 may not protrude from the top surface 113).

In particular, the recesses 111 also accommodate at least one third micro device 200, and the height of the third micro device 200 is greater than the height of the second micro device 300. The first micro device 400 may be a relatively thin micro device, the second micro device 300 and the third micro device 200 may be relatively thick micro devices.

Figure 2B:
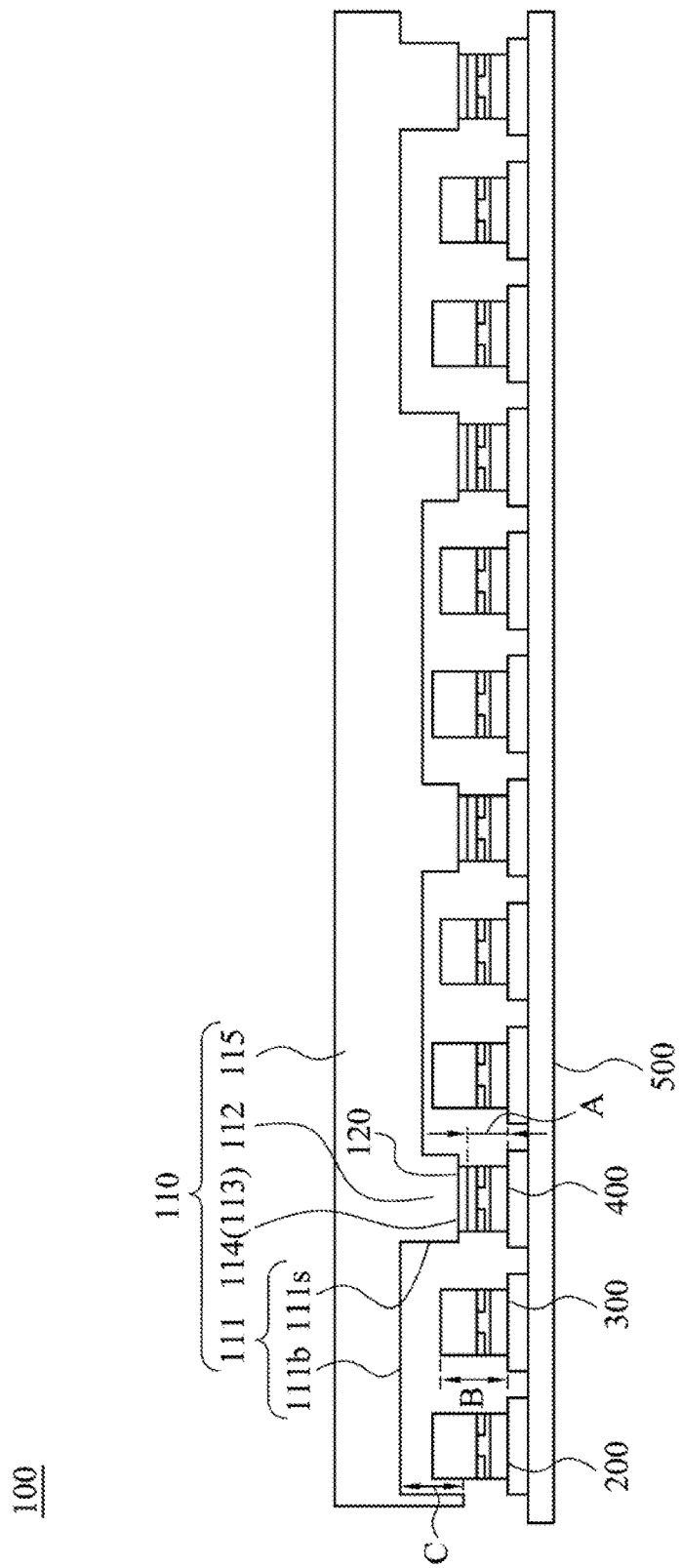
FIG. 2B is a schematic cross-sectional view of the transfer head array according to another embodiment of this disclosure.

In the embodiment, at least two of the recesses 111 have substantially the same depth. Embodiments of this disclosure are not limited thereto. FIG. 2B is a schematic cross-sectional view of the transfer head array 100 according to another embodiment of this disclosure. As shown in FIG. 2B, at least two of the recesses 111 may have different depths.

Figure 2C:
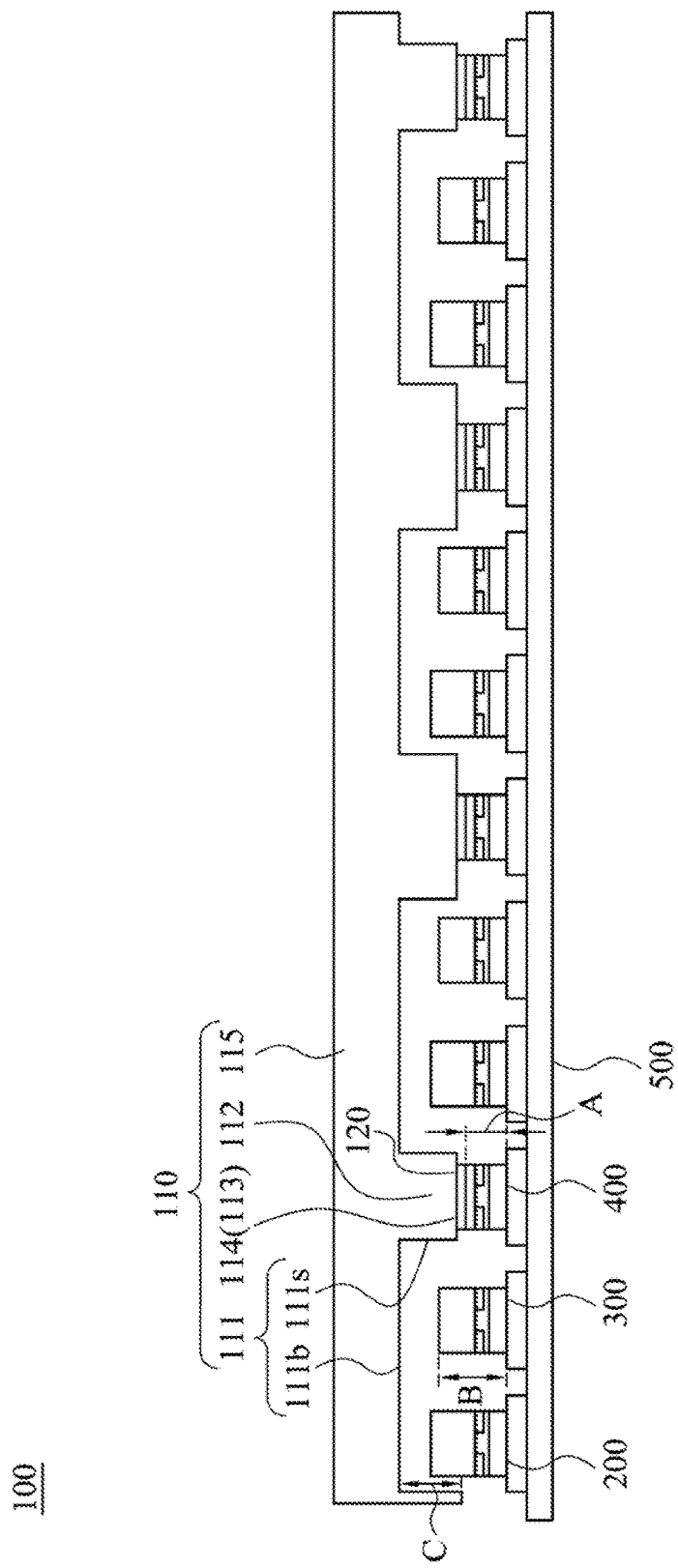
FIG. 2C is a schematic cross-sectional view of the transfer head array according to another embodiment of this disclosure.

Moreover, at least two of the recesses 111 have substantially the same size. Embodiments of this disclosure are not limited thereto. FIG. 2C is a schematic cross-sectional view of the transfer head array 100 according to another embodiment of this disclosure. As shown in FIG. 2C, at least two of the recesses 111 may have different sizes.

Specifically, at least one of the recesses 111 has a bottom surface 111b and at least one sidewall 111s substantially vertical to the bottom surface 111b. Embodiments of this disclosure are not limited thereto. In other embodiments, which will be discussed hereinafter, at least one of the recesses 111 may have the bottom surface 111b and the sidewall 111s substantially sloping between the bottom surface 111b and the grip regions 114 (or the top surface 113).

The height of the first micro device 400, the second micro device 300, and the third micro device 200 may be in a range from about 0.5 μm to about 1 mm.

The body 110 further has a base portion 115, and the wall portion 112 is disposed on the base portion 115. Further, the recess 111 is formed by etching the body 110, so the base portion 115 and the wall portion 112 are made of the same material. Embodiments of this disclosure are not limited thereto. In other embodiments, the recess 111 may be formed by other methods.

As shown in FIG. 1, the grip regions 114 are narrower than other regions of the top surface 113 of the wall portion 112. Embodiments of this disclosure are not limited thereto. In other embodiments, which will be discussed hereinafter, the grip regions 114 are wider than other regions of the top surface 113 of the wall portion 112.

Moreover, the grip regions 114 are aligned with each other. Embodiments of this disclosure are not limited thereto. In other embodiments, which will be discussed hereinafter, the grip regions 114 may be arranged in a staggered pattern.

Figure 3:
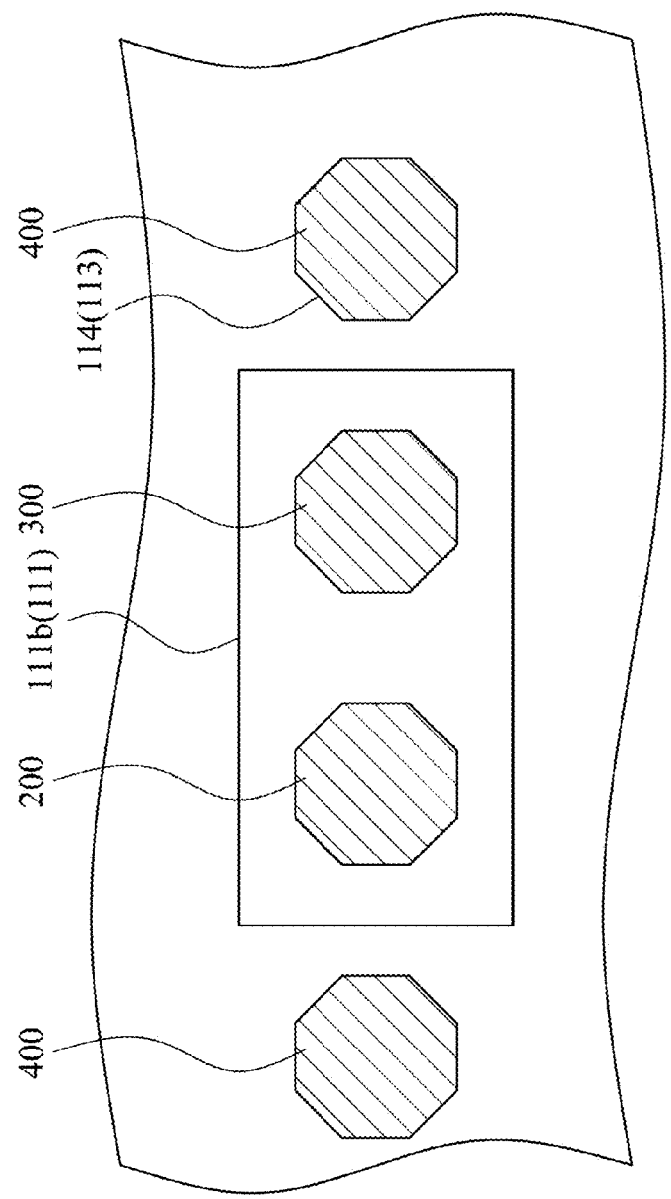
FIG. 3 is a schematic enlarged fragmentary bottom view of the transfer head array when the first micro devices gripped by the transfer head array are put on the receiving substrate according to one embodiment of this disclosure.

FIG. 3 is a schematic enlarged fragmentary bottom view of the transfer head array 100 of FIG. 1 when the first micro devices 400 gripped by the transfer head array 100 are put on the receiving substrate 500. As shown in FIG. 3, the vertical projections of the first micro devices 400 gripped by the transfer heads 120 on the top surface 113 are disposed in the grip regions 114 (the grip regions 114 and the first micro devices 400 overlap with each other here), and the second micro devices 300 and the third micro devices 200 are accommodated in the recesses 111. Therefore, the vertical projections of the second micro devices 300 and the third micro devices 200 are located on the bottom surfaces 111b of the recesses 111.

Figure 4:
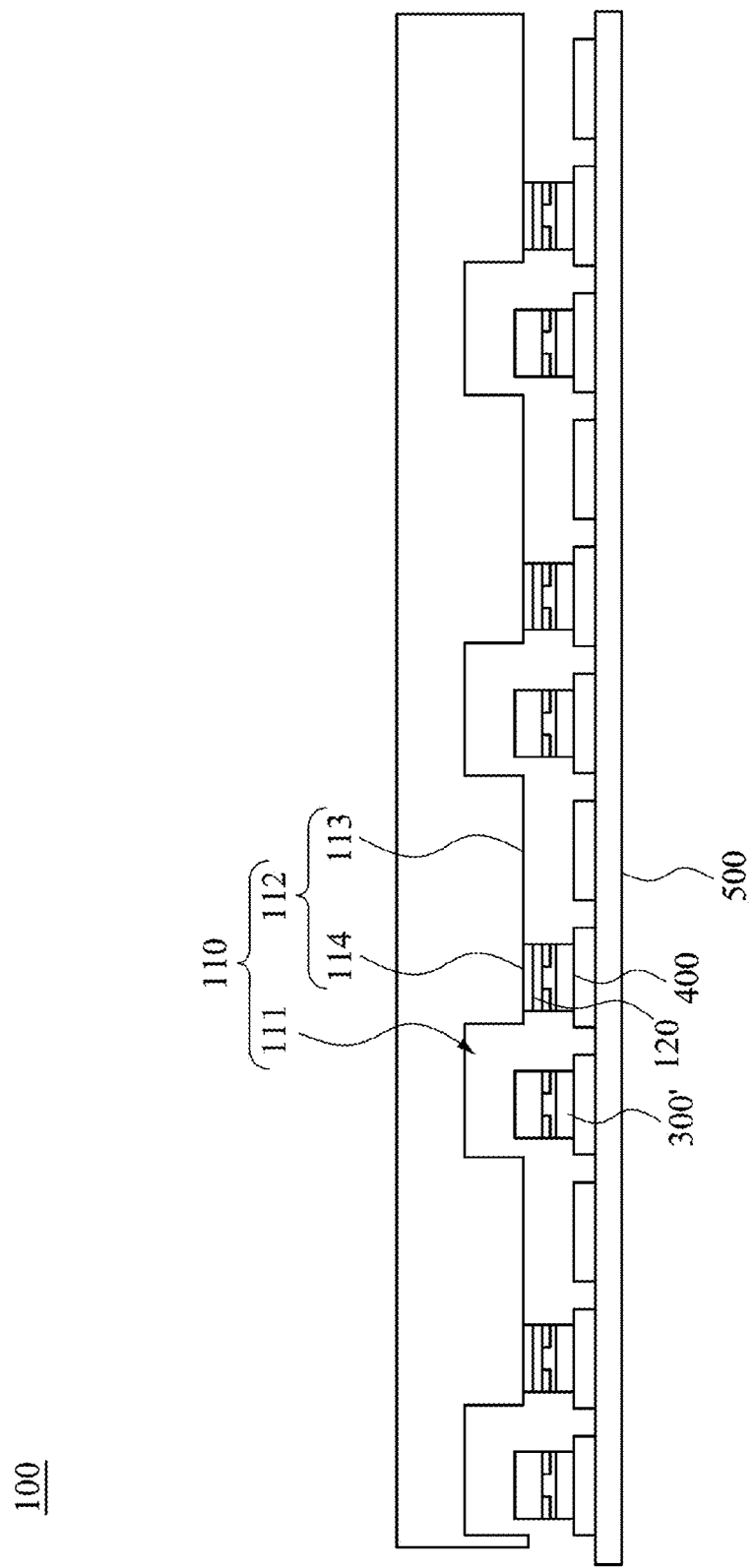
FIG. 4 is a schematic cross-sectional view of the transfer head array when the first micro devices gripped by the transfer head array are put on the receiving substrate according to another embodiment of this disclosure.
Figure 5:
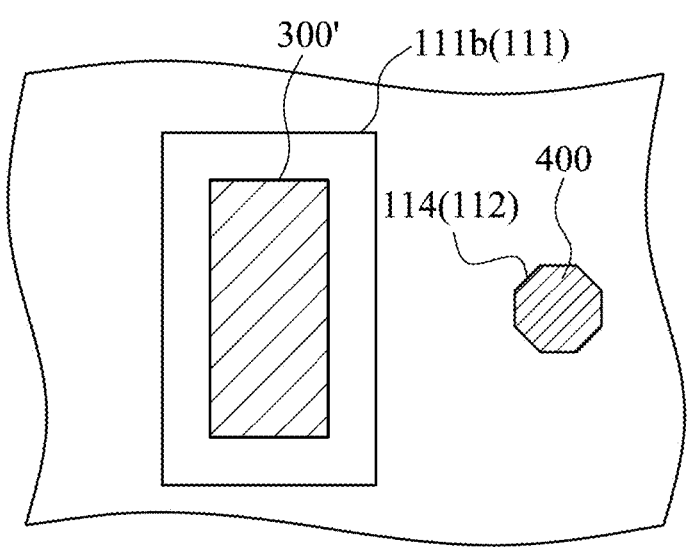
FIG. 5 is a schematic enlarged fragmentary bottom view of the transfer head array when the first micro devices gripped by the transfer head array are put on the receiving substrate according to another embodiment of this disclosure.

FIG. 4 is a schematic cross-sectional view of the transfer head array 100 when the first micro devices 400 gripped by the transfer head array 100 are put on the receiving substrate 500 according to another embodiment of this disclosure. FIG. 5 is a schematic enlarged fragmentary bottom view of the transfer head array 100 when the first micro devices 400 gripped by the transfer head array 100 are put on the receiving substrate 500 according to another embodiment of this disclosure. As shown in FIG. 4 and FIG. 5, this embodiment is similar to the embodiment of FIG. 2A and FIG. 3, and the differences between the two embodiments are that in this embodiment, only the second devices 300' are accommodated recesses 111, and the cross sections of the second micro devices 300' are greater than the second micro devices 300 in the embodiment of FIG. 2A and FIG. 3, The shapes of the recesses 111 can be designed according to the shapes of the second micro devices 300', such that the second micro devices 300' are accommodated in the recesses 111 when the first micro devices 400 gripped by the transfer head array 100 are put on the receiving substrate 500.

Moreover, the top surface 113 of the wall portion 112 is substantially flat. Embodiments of this disclosure are not limited thereto. In other embodiments, which will be discussed hereinafter, the grip regions 114 are higher than other regions of the top surface 113 of the wall portion 112.

The body 110 is made of quartz, silicon, glass, plastic, metal, ceramic or combinations thereof. Embodiments of this disclosure are not limited thereto. In other embodiments, the body 110 may be made of other materials.

Figure 6:
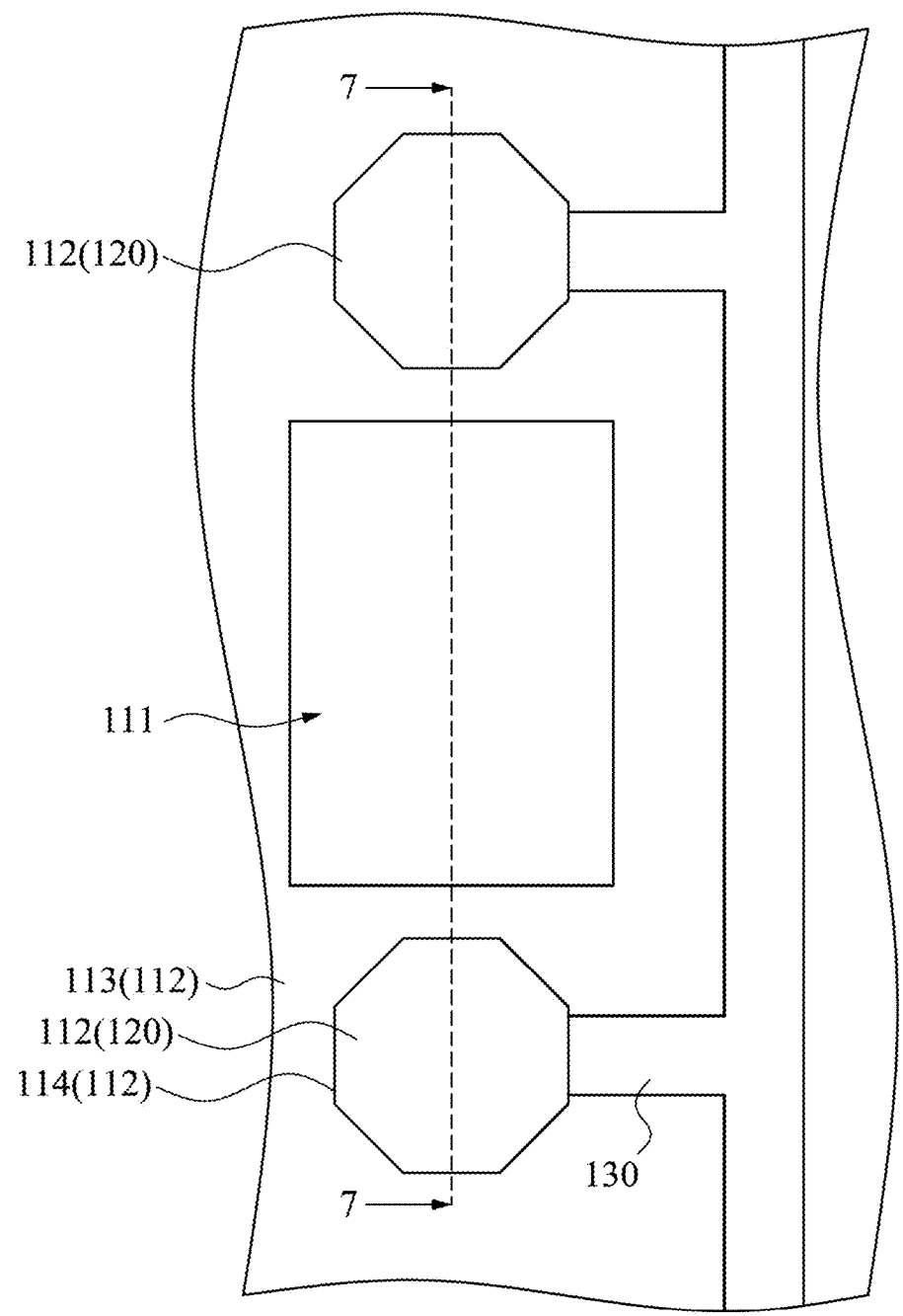
FIG. 6 is a schematic enlarged fragmentary view of FIG. 1.
Figure 7:
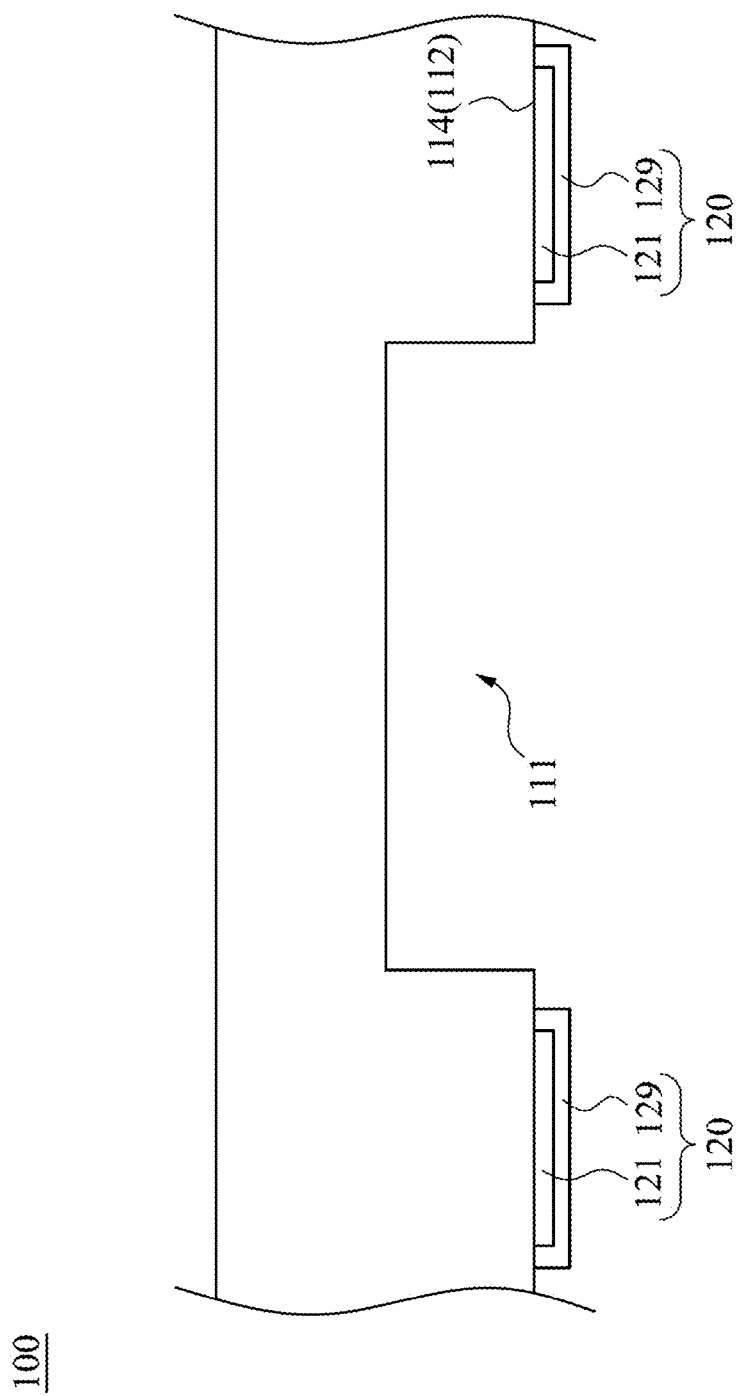
FIG. 7 is a schematic cross-sectional view taken along line 7-7 of FIG. 6.

FIG. 6 is a schematic enlarged fragmentary view of FIG. 1. FIG. 7 is a schematic cross-sectional view taken along line 7-7 of FIG. 6. As shown in FIG. 6 and FIG. 7, at least one of the transfer heads 120 includes an electrostatic chuck, and the electrostatic chuck includes at least one electrode 121 and a dielectric layer 129. The electrode 121 is disposed on the grip regions 114. The dielectric layer 129 overlays at least the electrode 121. In other words, the first micro device 400 is gripped by an the electrostatic force.

The transfer head array 100 further includes at least one electrode lead 130 electrically connected to the electrode 121. The electrode lead 130 may be disposed on the top surface 113, or specifically, regions complementary to the grip regions 114 of the top surface 113. Therefore, the electrode lead 130 may be disposed at the same level as the electrode 121, such that the forming process of the electrode 121 and the electrode lead 130 is made easier and the structure of the connecting portion of the electrode 121 and electrode lead 130 is made more rigid. In addition, in order to make the connecting portion of the electrode 121 and electrode lead 130 more rigid, the electrode 121 and the electrode lead 130 may be formed by the same process.

The bottom surface of the electrode 121 may be octagonal in shape. Embodiments of this disclosure are not limited thereto. In other embodiments, the bottom surface of the electrode 121 may be formed having other shapes.

The thickness of the dielectric layer 129 may be in a range from about 0.05 μm to about 1 mm. Embodiments of this disclosure are not limited thereto.

The electrode 121 is made of a conductive material, and specifically, metal, such as aluminum, titanium, or silver. Embodiments of this disclosure are not limited thereto.

The electrode lead 130 is made of a conductive material, and specifically, metal, such as aluminum, titanium, or silver. Embodiments of this disclosure are not limited thereto.

The dielectric layer 129 is made of a dielectric material, such as hafnium(IV) oxide (HfO2), silicon dioxide (SiO2), tantalum pentoxide (Ta2O5), titanium dioxide (TiO2), zirconium dioxide (ZrO2), or aluminium oxide (Al2O3). Alternatively, the dielectric layer 129 is made of a mixture of nano-particles of dielectric material or ferroelectric material and at least one polymer material, such as polymethylmethacrylate, in which the nano-particles are dispersed in the polymer material. That is, dielectric layer 129 is made of a composite polymer.

The transfer heads 120 pick up the first micro device 400 by an electrostatic force. Specifically, the transfer heads 120 pick the first micro device 400 by a Coulomb force, the Johnsen-Rahbek effect, or combinations thereof. Depending upon the resistance of the dielectric layer 129 and the gap between the transfer head 120 and the first micro device 400, either a Coulomb force or the Johnsen-Rahbek effect may function to provide the majority of the gripping effect.

The electrostatic force generated by the transfer heads 120 satisfies the following equation:

$$P = \frac{\varepsilon_0 V_0^2}{2} \left[ \overbrace{\left( \frac{K}{t_D + K(\delta + t_{CL})} \right)^2}^{\text{Coulomb term}} + \alpha \overbrace{\left( \frac{(R_{CL}/R_V)}{t_{CL}\{1 + (R_{CL}/R_V)\}} \right)^2}^{\text{J-R term}} \right]$$

In the above equation, P represents the electrostatics force per unit area, $\varepsilon_0$ represents the permittivity of free space, $V_0$ represents the potential difference between the electrode 121 and the carrier substrate, K represents the relative dielectric constant, $t_D$ represents the thickness of the dielectric layer 129, δ represents the physical gap between the dielectric layer 129 and the first micro device 400, $t_{CL}$ represents the thickness of a contact portion of the dielectric layer 129, α represents the empirical factor of the nonuniform charge distribution on the interface of the transfer head 120, $R_V$ represents the volume resistance of the dielectric layer 129, and $R_{CL}$ represents the resistance of the contact portion of the dielectric layer 129.

When the dielectric layer 129 is made of a mixture of nano-particles of dielectric materials or ferroelectric materials and at least one polymer material, the breakdown voltage of the nano-particles may be increased. Therefore, even if a larger attraction force is needed to pick up the first micro device 400, a larger voltage can be applied to the electrode 121 without breakdown.

The dielectric layers 129 of two adjacent transfer heads 120 are separated from each other. Embodiments of this disclosure are not limited thereto. In other embodiments, which will be discussed hereinafter, the dielectric layers 129 of two adjacent transfer heads 120 may be physically contacted with each other.

Figure 8:
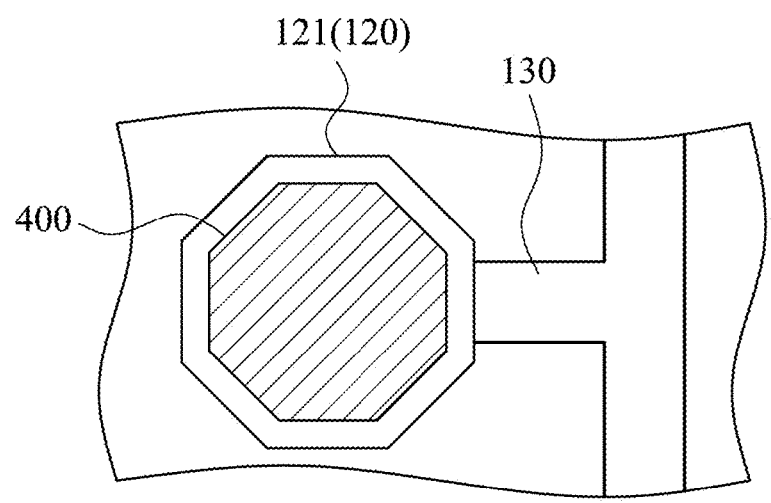
FIG. 8 is another schematic enlarged fragmentary view of FIG. 1.

FIG. 8 is another schematic enlarged fragmentary view of FIG. 1. As shown in FIG. 8, the bottom surface of the electrode 121 is greater than the vertical projection of the first micro device 400 on the bottom surface of the electrode 121, and there is a gap between the edge of the bottom surface of the electrode 121 and the edge of the vertical projection of the first micro device 400 on the bottom surface of the electrode 121.

Figure 9:
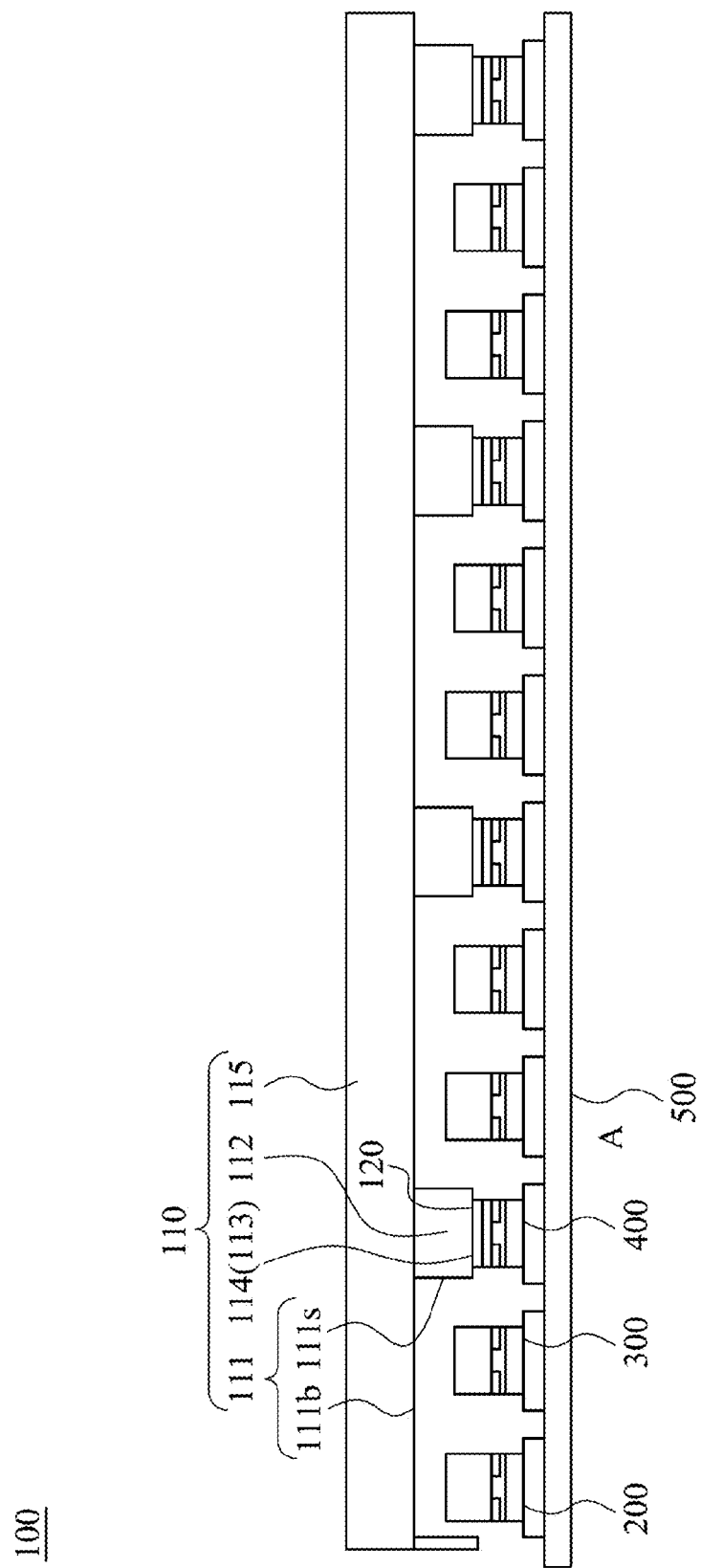
FIG. 9 is a schematic cross-sectional view of the transfer head array according to another embodiment of this disclosure.

FIG. 9 is a schematic cross-sectional view of the transfer head array 100 according to another embodiment of this disclosure. As shown in FIG. 9, this embodiment is similar to the embodiment of FIG. 1, and the differences between the two embodiments are that in this embodiment, a polymer layer for example, photoresist, is formed on the base portion 115, and then the polymer layer is patterned to form the wall portion 112. Therefore, the base portion 115 and the wall portion 112 are made of different materials.

Specifically, the polymer layer and the wall portion 112 are made of a photoresist material, such as SU-8. Embodiments of this disclosure are not limited thereto.

Figure 10:
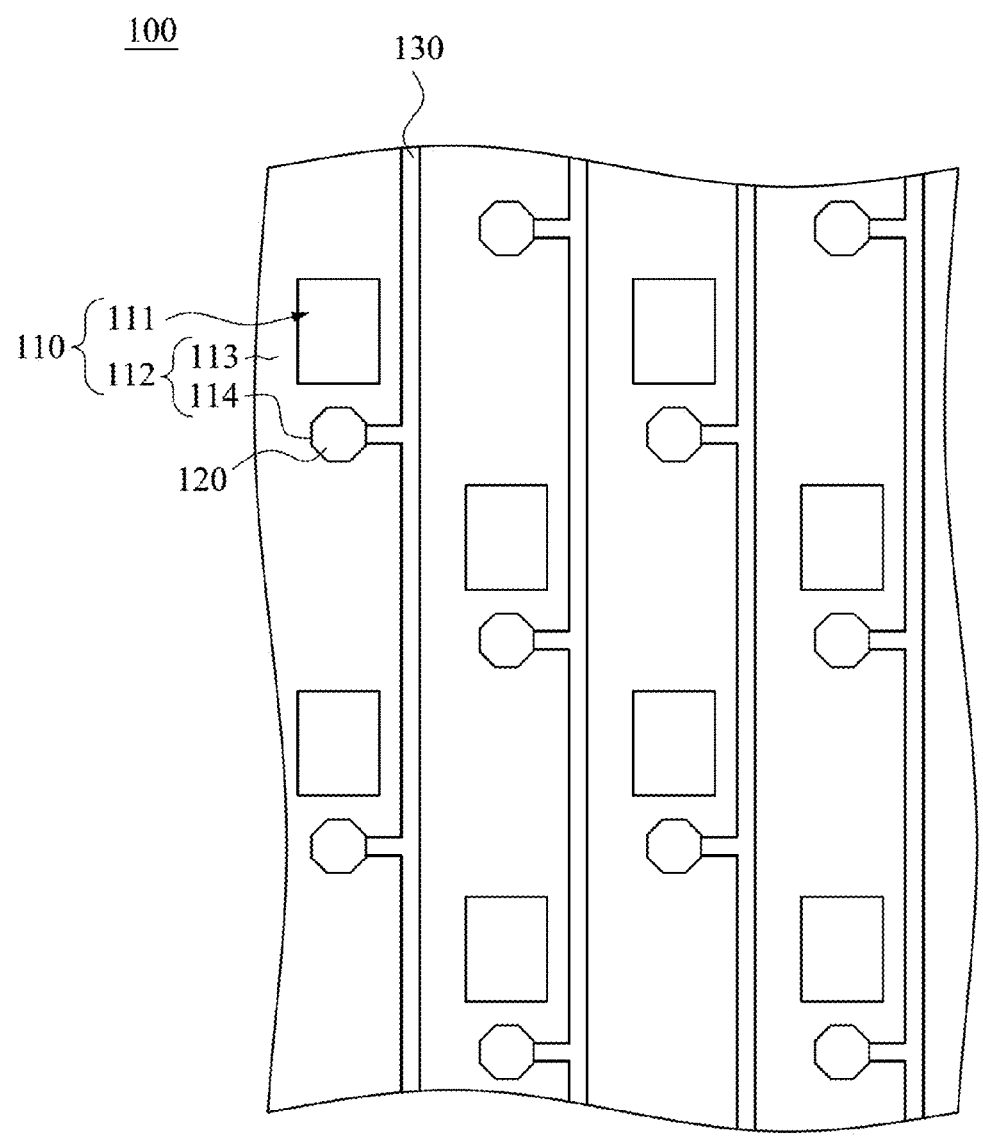
FIG. 10 is a schematic bottom view of the transfer head array according to another embodiment of this disclosure.

FIG. 10 is a schematic bottom view of the transfer head array 100 according to another embodiment of this disclosure. As shown in FIG. 10, this embodiment is similar to the embodiment of FIG. 1, and the differences between the two embodiments are that in this embodiment, the grip regions 114 is arranged in a staggered pattern.

Figure 11:
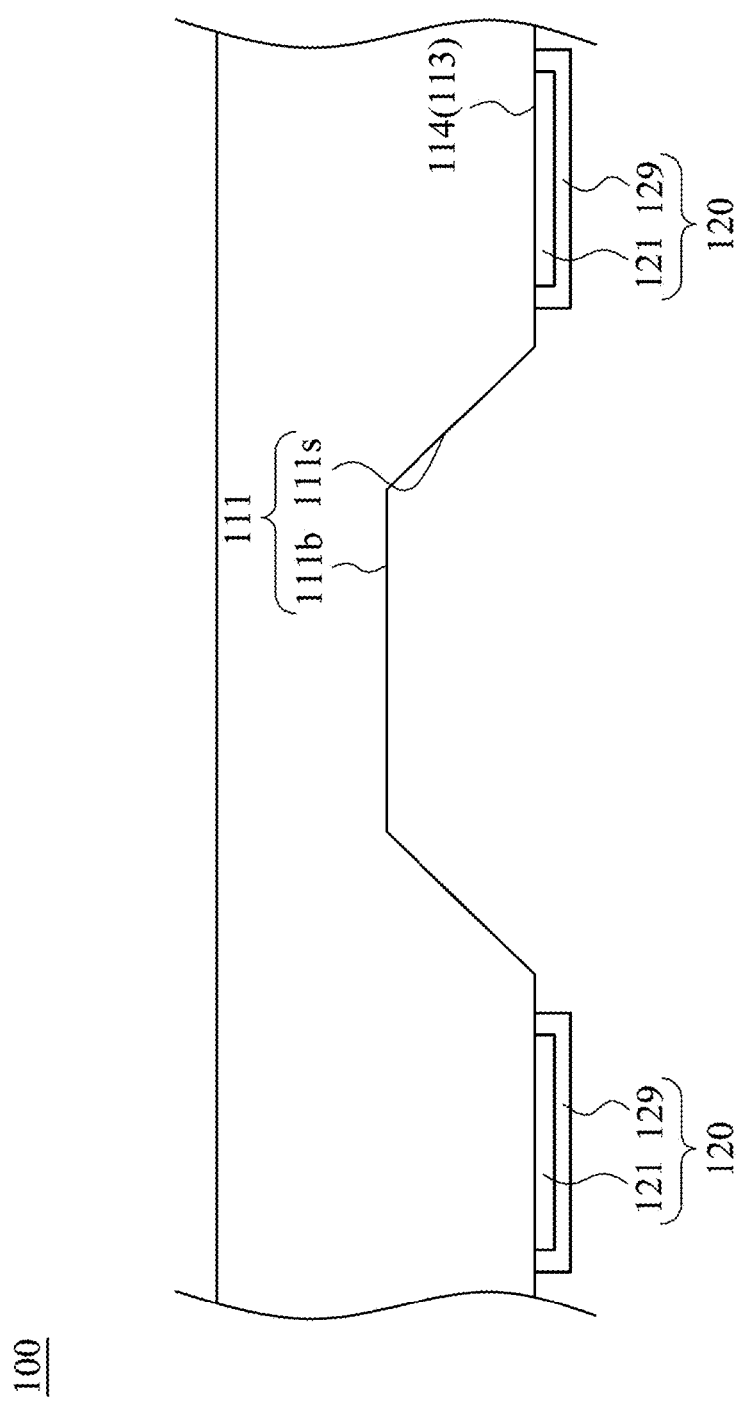
FIG. 11 is a schematic cross-sectional view of the transfer head array according to another embodiment of this disclosure.

FIG. 11 is a schematic cross-sectional view of the transfer head array 100 according to another embodiment of this disclosure. As shown in FIG. 11, this embodiment is similar to the embodiment of FIG. 7, and the differences between the two embodiments are that in this embodiment, at least one of the recesses 111 may have the bottom surface 111b and the sidewall 111s substantially sloping between the bottom surface 111b and the grip regions 114 (or the top surface 113).

Figure 12:
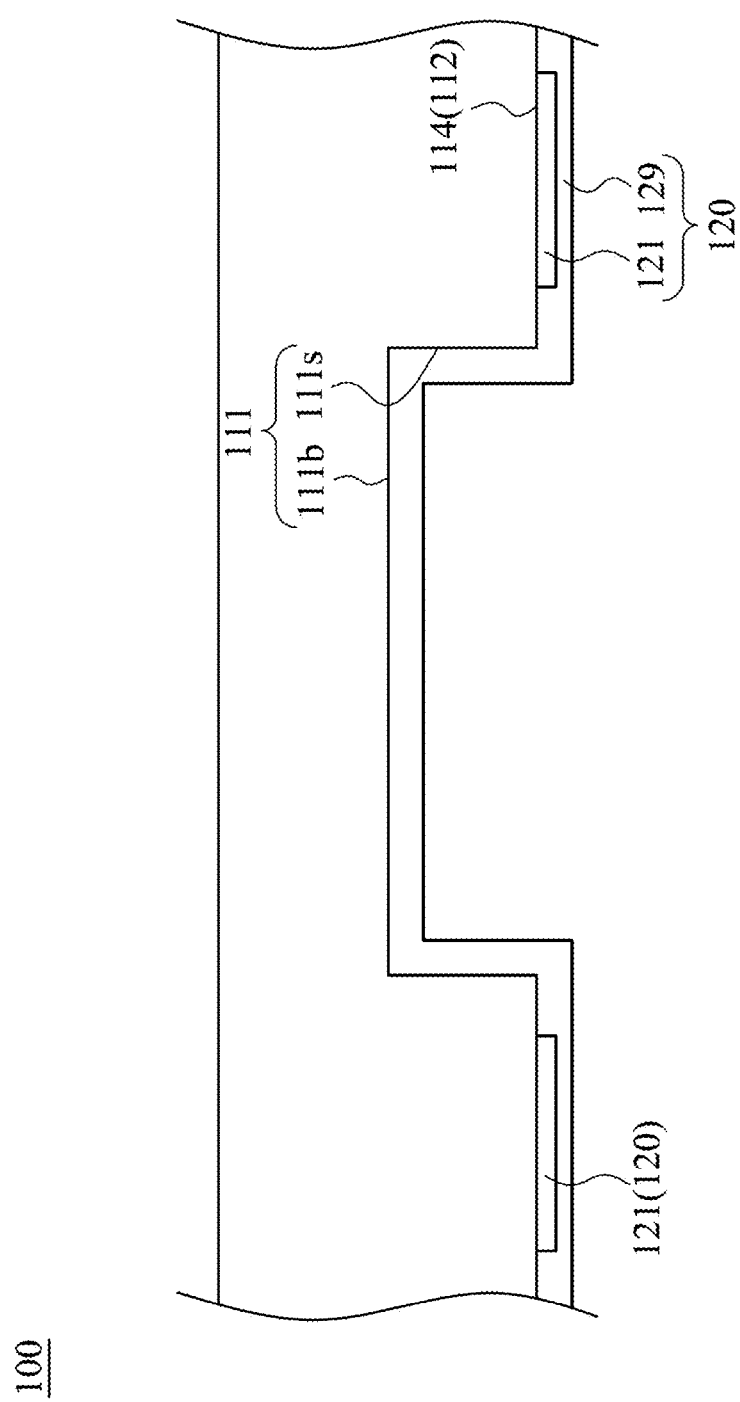
FIG. 12 is a schematic cross-sectional view of the transfer head array according to another embodiment of this disclosure.

FIG. 12 is a schematic cross-sectional view of the transfer head array 100 according to another embodiment of this disclosure. As shown in FIG. 12, this embodiment is similar to the embodiment of FIG. 7, and the differences between the two embodiments are that in this embodiment, the dielectric layers 129 of two adjacent transfer heads 120 may be physically contacted with each other, and the dielectric layer 129 further overlay sidewalls 111s and bottom surfaces 111b of the recesses 111.

Figure 13:
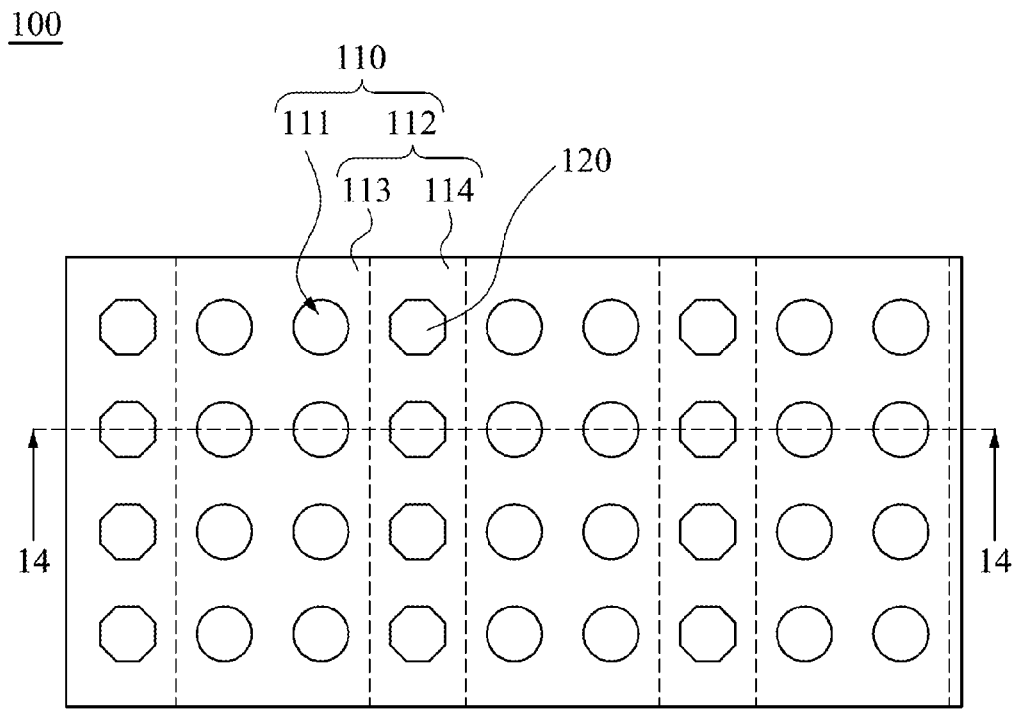
FIG. 13 is a schematic bottom view of the transfer head array according to another embodiment of this disclosure.
Figure 14:
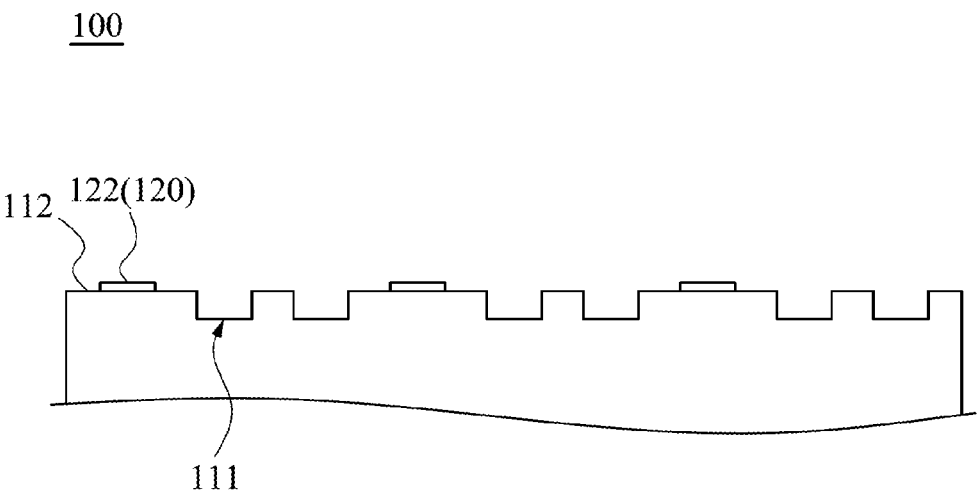
FIG. 14 is a schematic cross-sectional view taken along line 14-14 of FIG. 13.

FIG. 13 is a schematic bottom view of the transfer head array 100 according to another embodiment of this disclosure. FIG. 14 is a schematic cross-sectional view taken along line 14-14 of FIG. 13. The transfer head array 100 in this embodiment is similar to the transfer head array 100 in the aforementioned embodiments, and the differences between the embodiments is that in this embodiment, each of the recesses 111 is configured to accommodate at least one object which is located on the receiving substrate 500 (see FIG. 2A) when the transfer heads 120 (see FIG. 2A) with the first micro device 400 (see FIG. 2A) touch the receiving substrate 500 and at least one of the transfer heads 120 has a patterned adhesive layer 121. In other words, the first micro device 400 is gripped by an adhesion force.

Similarly, the object on the receiving substrate 500 (see FIG. 2A) may be the second micro device 300 (see FIG. 2A) or the third micro device 200 (see FIG. 2A). Embodiments of this disclosure are not limited thereto. In other embodiments, the object may be some components or protruding structures disposed on the receiving substrate 500 (see FIG. 2A). The object may also be some particles located on the receiving substrate 500, and the particles may affect the bonding of the first micro device 400 (see FIG. 2A).

Figure 15:
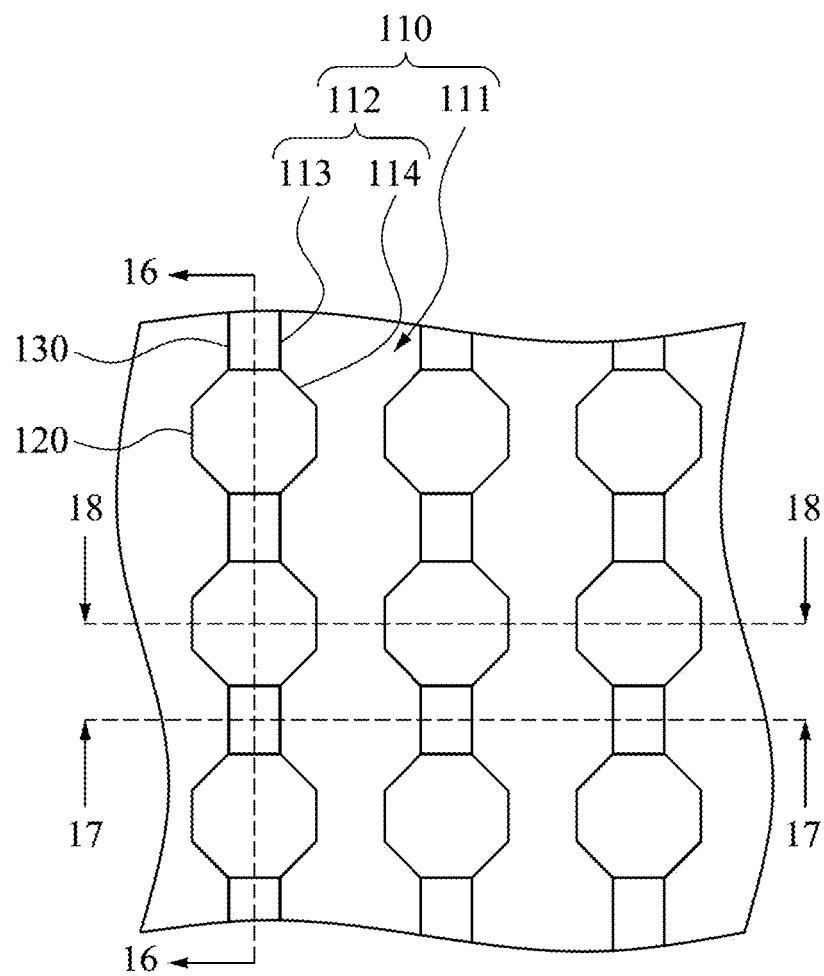
FIG. 15 is a schematic bottom view of the transfer head array according to another embodiment of this disclosure.

FIG. 15 is a schematic bottom view of the transfer head array 100 according to another embodiment of this disclosure. As shown in FIG. 15, the transfer head array 100 in this embodiment is similar to the transfer head array 100 in the aforementioned embodiments. The differences are described below.

As shown in FIG. 15, the grip regions 114 are wider than other regions of the top surface 113 of the wall portion 112. The electrode lead 130 approximately fills regions complementary to the grip regions 114 of the top surface 113 of the wall portion 112.

The top surface 113 of the wall portion 112 is strip-shaped. Embodiments of this disclosure are not limited thereto.

Figure 16:
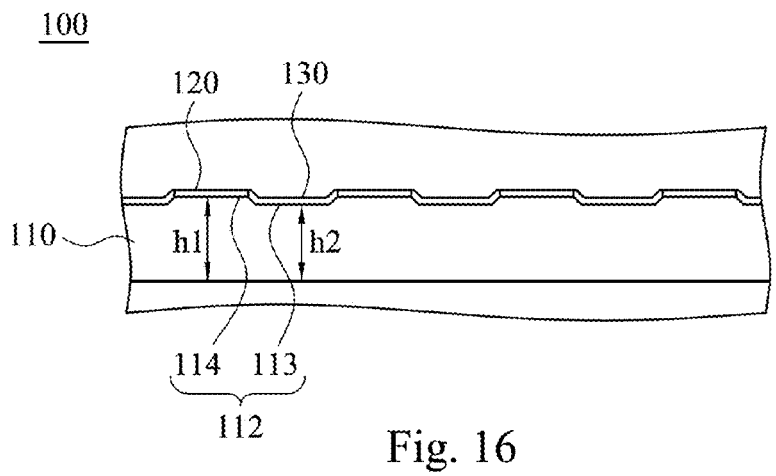
FIG. 16 is a schematic cross-sectional view taken along line 16-16 of FIG. 15.

FIG. 16 is a schematic cross-sectional view taken along line 16-16 of FIG. 15. As shown in FIG. 16, the grip regions 114 are higher than other regions of the top surface 113 of the wall portion 112. In other words, the grip regions 114 have a height h1, regions complementary to the grip regions 114 of the top surface 113 of the wall portion 112 have a height h2, and h1 is greater than h2.

Figure 17:
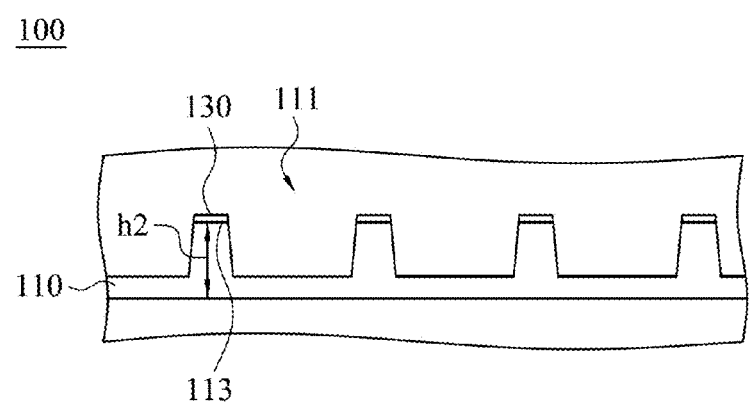
FIG. 17 is a schematic cross-sectional view taken along line 17-17 of FIG. 15.
Figure 18:
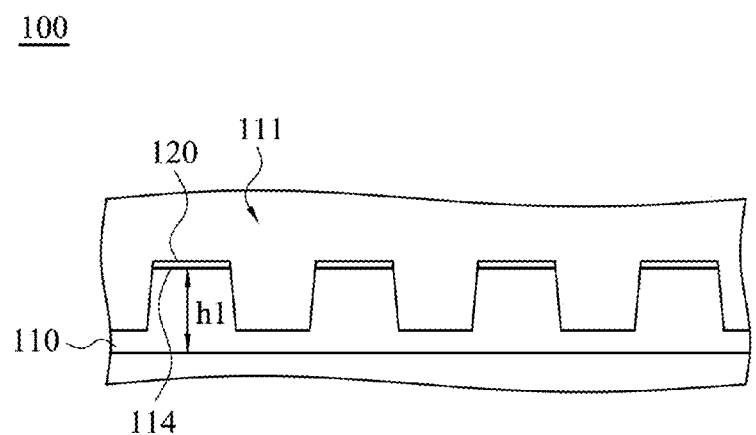
FIG. 18 is a schematic cross-sectional view taken along line 18-18 of FIG. 15.

FIG. 17 is a schematic cross-sectional view taken along line 17-17 of FIG. 15. FIG. 18 is a schematic cross-sectional view taken along line 18-18 of FIG. 15. As shown in FIG. 17 and FIG. 18, a width of parts of the recesses 111 between the regions complementary to the grip regions 114 of the top surface 113 is greater than a width of parts of the recesses 111 between the grip regions 114.

Figure 19:
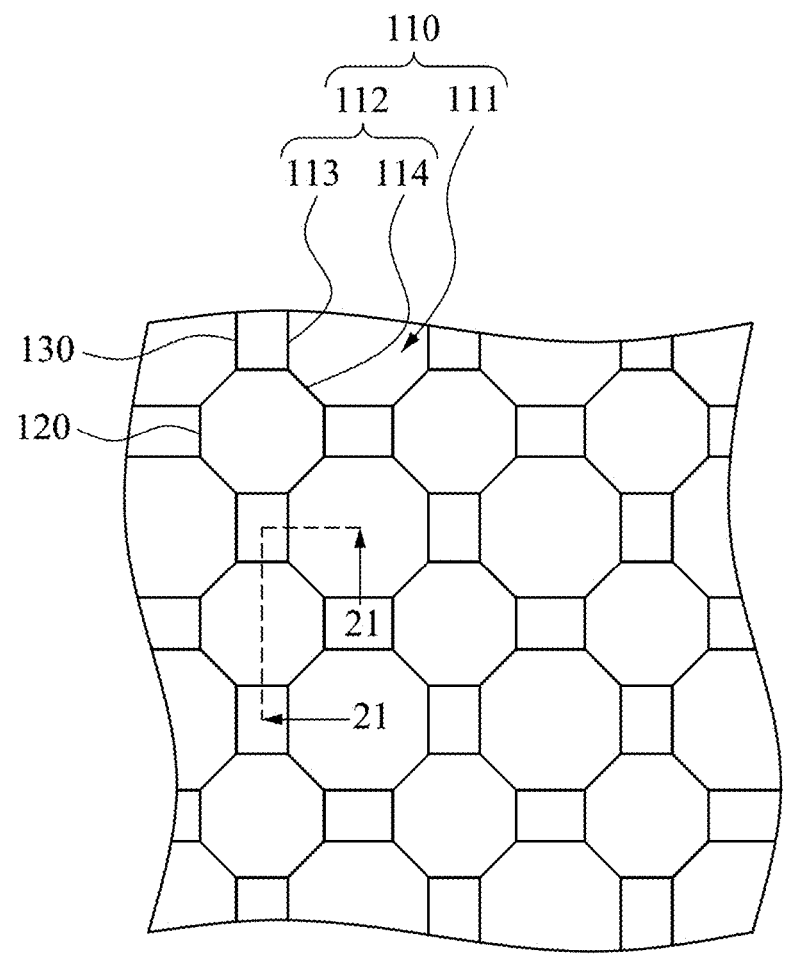
FIG. 19 is a schematic bottom view of the transfer head array according to another embodiment of this disclosure.

FIG. 19 is a schematic bottom view of the transfer head array 100 according to another embodiment of this disclosure. As shown in FIG. 19, the transfer head array 100 in this embodiment is similar to the transfer head array 100 of FIG. 15, and one difference is that the top surface 113 of the wall portion 112 is grid-shaped (the other difference will be discussed hereinafter).

Figure 20:
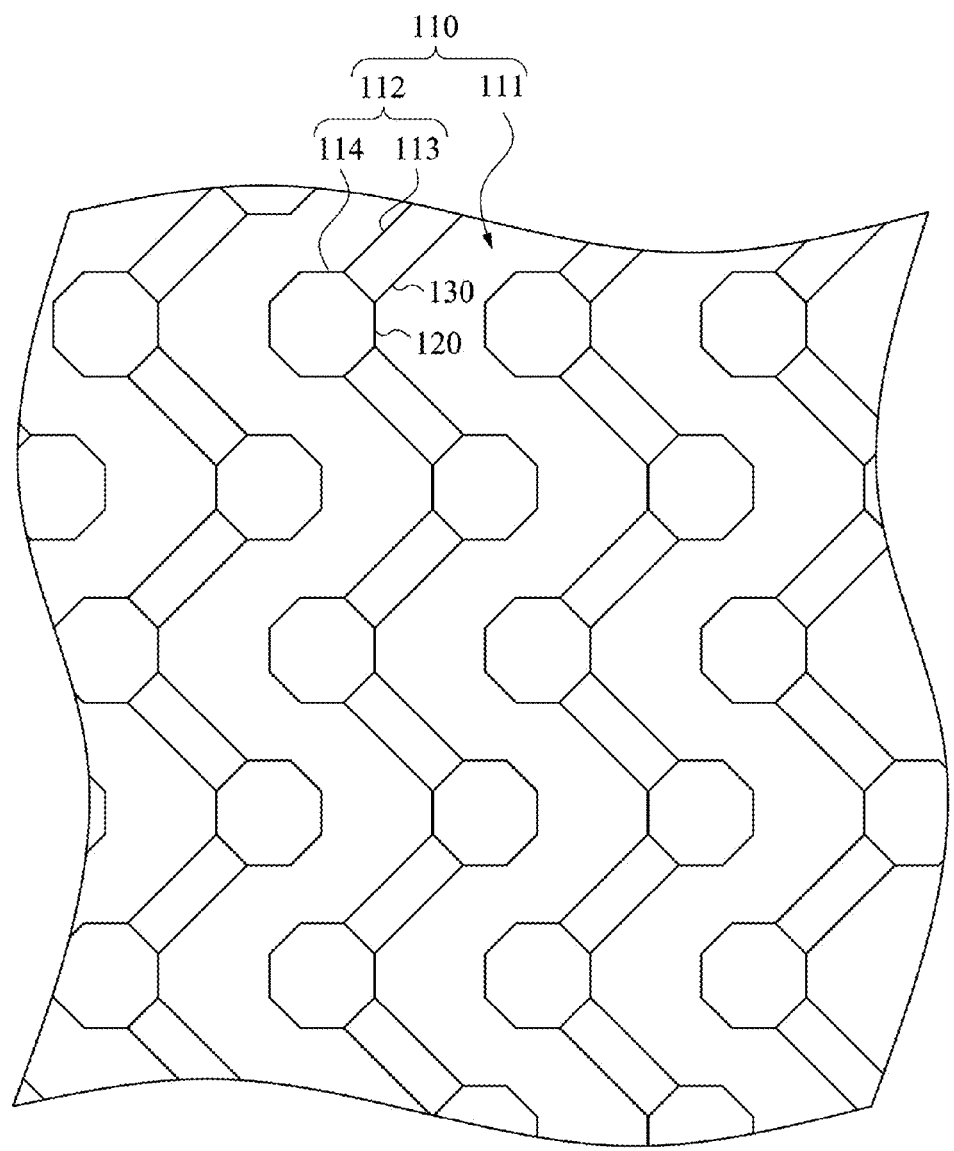
FIG. 20 is a schematic bottom view of the transfer head array according to another embodiment of this disclosure.

FIG. 20 is a schematic bottom view of the transfer head array 100 according to another embodiment of this disclosure. As shown in FIG. 20, the transfer head array 100 in this embodiment is similar to the transfer head array 100 of FIG. 15, and the difference is that the top surface 113 of the wall portion 112 of this embodiment is zigzag-shaped. Embodiments of this disclosure are not limited to the aforementioned embodiments. In other embodiments, the top surface 113 of the wall portion 112 may be in other shapes, such as a combination of a grid shape and a strip shape.

Figure 21:
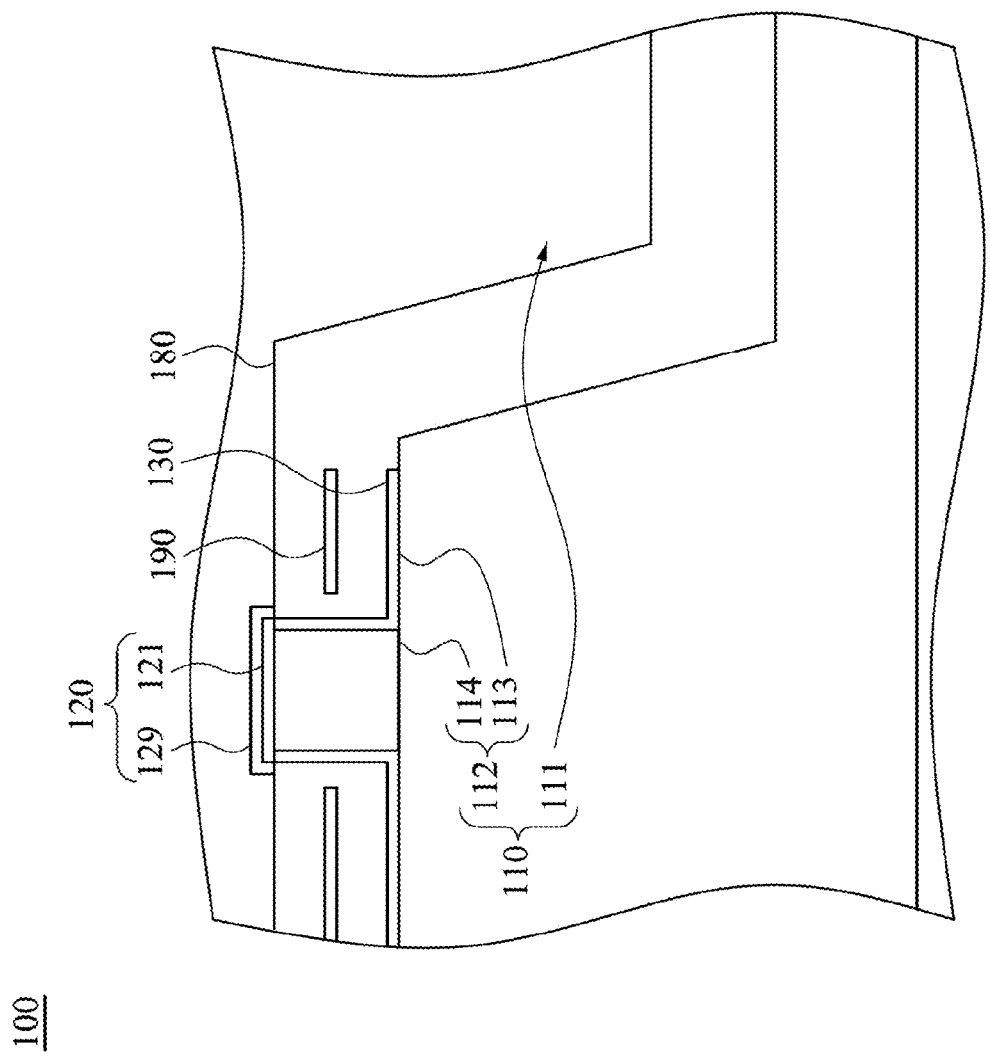
FIG. 21 is a schematic cross-sectional view taken along line 21-21 of FIG. 19.

FIG. 21 is a schematic cross-sectional view taken along line 21-21 of FIG. 19. As shown in FIG. 21, the transfer head array 100 further includes an isolation layer 180 and a shielding layer 190. The isolation layer 180 overlays at least the wall portion 112, and the transfer heads 120 are disposed at least partially on the isolation layer 180. The shielding layer 190 is disposed in the isolation layer 180, and the vertical projection of the shielding layer 190 on the top surface 113 of the wall portion 112 at least partially overlaps with an area complementary to the grip regions 114 (the vertical projection of the transfer heads 120 on the top surface 113 is disposed in the grip regions 114).

Through such a configuration, the shielding layer 190 may perform electrical shielding to prevent generating an unnecessary grip force in the other regions rather the regions where the transfer heads 120 are located. For example, in the embodiment, the shielding layer 190 performs electrical shielding to prevent a grip force from being generated by the electrode lead 130, which is disposed below the shielding layer 190.

Figure 22:
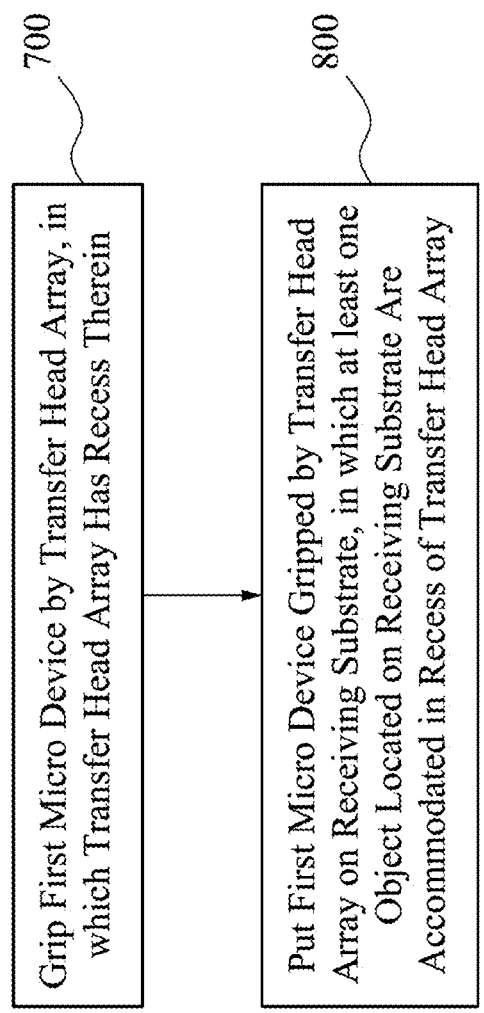
FIG. 22 is a flow chart of a transferring method according to one embodiment of this disclosure.

FIG. 22 is a flow chart of a transferring method according to one embodiment of this disclosure. At operation 700, at least one first micro device 400 is gripped by a transfer head array 100, in which the transfer head array 100 has at least one recess 111 therein. At operation 800, the first micro device 400 gripped by the transfer head array 100 is put on the receiving substrate 500, in which at least one object located on the receiving substrate 500 is accommodated in the recess 111 of the transfer head array 100.

Because when the first micro device 400 is transferred from the carrier substrate to the receiving substrate 500 by the transfer head array 100, there may be some objects, such as the second micro device 300, the convex structures, protrusion structures, or the particles, located on the receiving substrate 500. In order to avoid mechanical interference with the objects, the transfer head array 100 has the recesses 111 to accommodate the object when the transfer heads 120 with the first micro device 400 touch the receiving substrate 500.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. § 112, 6th paragraph. In particular, the use of "step of" in the claims herein is not intended to invoke the provisions of 35 U.S.C. § 112, 6th paragraph.

What is claimed is:

1. A transfer head array, comprising:
  a body comprising:
    a base portion; and
    at least one wall portion on the base portion, wherein the wall portion defines a plurality of recesses in the body, the wall portion completely encloses a perimeter of each of the recesses in the body, the wall portion has a top surface, and the top surface of the wall portion has a plurality of grip regions; and
  a plurality of transfer heads respectively on the grip regions.

2. The transfer head array of claim 1, wherein the top surface of the wall portion is substantially flat.

3. The transfer head array of claim 1, wherein the grip regions are higher than other regions of the top surface of the wall portion.

4. The transfer head array of claim 1, wherein the grip regions are wider than other regions of the top surface of the wall portion.

5. The transfer head array of claim 1, wherein the grip regions are narrower than other regions of the top surface of the wall portion.

6. The transfer head array of claim 1, wherein at least two of the recesses have different depths.

7. The transfer head array of claim 1, wherein at least two of the recesses have different sizes.

8. The transfer head array of claim 1, wherein the top surface of the wall portion is strip-shaped, grid-shaped, zigzag-shaped, or combinations thereof.

9. The transfer head array of claim 1, wherein the grip regions are aligned with each other.

10. The transfer head array of claim 1, wherein the grip regions are arranged in a staggered pattern.

11. The transfer head array of claim 1, wherein at least one of the transfer heads comprises:
at least one electrode disposed on at least one of the grip regions; and
a dielectric layer overlaying at least the electrode.

12. The transfer head array of claim 11, wherein the dielectric layer is made of a mixture of nano-particles of a dielectric or ferroelectric material and at least one polymer material.

13. The transfer head array of claim 11, further comprising:
at least one electrode lead electrically connected to the electrode and on the top surface of the wall portion.

14. The transfer head array of claim 1, further comprising:
an isolation layer overlaying at least the wall portion, wherein the transfer heads are disposed at least partially on the isolation layer; and
a shielding layer disposed in the isolation layer, wherein a vertical projection of the shielding layer on the top surface of the wall portion at least partially overlaps with an area complementary to the grip regions.

15. The transfer head array of claim 1, wherein the transfer heads has a patterned adhesive layer.

16. The transfer head array of claim 1, wherein the base portion and the wall portion are made of the same material.

17. The transfer head array of claim 1, wherein the base portion and the wall portion are made of different materials.

18. The transfer head array of claim 1, wherein at least two of the recesses are isolated from each other by the wall portion.

19. The transfer head array of claim 1, wherein each of the recesses is open only at a side facing away from the base portion.

20. The transfer head array of claim 1, wherein the perimeter of each of the recesses is closed and defined by the wall portion.

21. A micro device transferring method, comprising:
gripping at least one first micro device by at least one transfer head of a transfer head array, wherein the transfer head array has at least one wall portion defining at least one recess; wherein an entire perimeter of the at least one recess is enclosed by said at least one wall; and
putting the first micro device gripped by the transfer head of the transfer head array on a receiving substrate, wherein when putting the first micro device gripped by the transfer head of the transfer head array on the receiving substrate, at least one second micro device is located on the receiving substrate, a top surface of the second micro device is higher than a gripping surface of the transfer head in relation to the receiving substrate, the gripping surface is where the first micro device is gripped, and the second micro device is at least partially received in the recess, such that the second micro device is free from contact with the transfer head array.

22. The micro device transferring method of claim 21, wherein the first micro device has a height A, the second micro device has a height B, the recess has a depth C, and $A+C>B$.

* * * * *